(12) United States Patent
Forbes et al.

(10) Patent No.: US 6,255,156 B1
(45) Date of Patent: Jul. 3, 2001

(54) METHOD FOR FORMING POROUS SILICON DIOXIDE INSULATORS AND RELATED STRUCTURES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/796,289

(22) Filed: Feb. 7, 1997

(51) Int. Cl.[7] .......................... H01L 21/20; H01L 21/36; C30B 00/00

(52) U.S. Cl. .................... 438/235; 438/479; 438/960; 438/637; 257/3

(58) Field of Search .................... 434/479; 257/3

(56) References Cited

U.S. PATENT DOCUMENTS

| 5,165,283 | 11/1992 | Kurtz et al. ............... 73/727 |
| 5,286,565 | 2/1994 | Holzl et al. ............... 428/408 |
| 5,298,767 | 3/1994 | Shor et al. ............... 257/77 |
| 5,454,915 | 10/1995 | Shor et al. ............... 204/129.3 |
| 5,472,913 | 12/1995 | Havemann et al. . |
| 5,548,159 | 8/1996 | Jeng . |
| 5,569,932 | * 10/1996 | Shor et al. . |
| 5,597,738 | * 1/1997 | Kurtz et al. . |
| 5,885,871 | 3/1999 | Chan et al. . |

OTHER PUBLICATIONS

Powell et al., Growth and Characterization of Cubic SiC Single–Crystal Films on Si, Journal of the Electrochemical Society, vol. 134, No. 6, pp. 1558–1565, 1987*

Mimura et al., Light Emitting Devices Using Porous Silicon and Porous Silicon Carbide, Solid–State Electronics, vol. 40, Nos. 1–8, pp. 501–504.*

Shor et al, "Direct observation of porous SiC formed by anodization in HF," Appl. Phys. Lett. 62 (22) pp. 2836–2837, 1993.*

Danishevskii et al "Intense photoluminescence of porous layers of SiC films grown on silicon substrates," Semiconductors 31 (4) pp. 354–358, 1997.* van de Lagemaat et al "Enhancement of the light–to–current conversion efficiency in an n–SiC/solution diode by porous etching," Appl. Phys. Lett 69 (15), pp. 2246, Oct. 7, 1996.*

Mimura et al, "Blue electroluminescence from porous silicon, carbide" Appl. Phys. Lett. 65 (26) p. 3350, Dec. 1994.*

Jessensky et al "Microstructure and photoluminescence of electrochemically etched porous SiC," Thin Silid Films, 298, pp. 224–228, 1997.*

Gherasim–Vrinceanu et al "On porosity and pore size distribution of macroporous silicon layers by scanning electron microscopy investigations," IEEE, p. 181, 1997.*

Jung et al "Developments in Luminescent Porous Si," J. Electrochem. Soc. vol. 140 No. 10, pp. 3046–3064, 1993.*

Smith et al, "Porous sikicon formation mechaninisms," J. Appl. Phys. 71 (8) pp. R1–R22, 1992.*

J.M. Agullo et al., "Graduated $Si_xC_{1-x}$ Ceramic Thin Films Deposited By Thermal Decomposition of Hydrocarbons and Tetraethylsilane", *Advances in Inorganic Films and Coatings*, 199–205 (1995).

(List continued on next page.)

Primary Examiner—Lynne A. Gurley
Assistant Examiner—Joanthan Hack
(74) Attorney, Agent, or Firm—Mueting, Raasch & Gebhardt, P.A.

(57) ABSTRACT

A porous silicon dioxide insulator having a low relative dielectric constant of about 2.0 or less is formed from a silicon carbide base layer. Initially, at least one layer of silicon carbide is deposited on a semiconductor substrate. The silicon carbide layer is then etched to form a porous silicon carbide layer, which is oxidized to produce the final porous silicon dioxide layer.

20 Claims, 6 Drawing Sheets

OTHER PUBLICATIONS

M.B. Anand et al., "NURA: A Feasible, Gas–Dielectric Interconnect Process", 1996 Symposium on VSLI Technology Digest of Technical Papers, 82–83 (1996).

P. Friedrichs et al., "Interface properties of metal–oxide–semiconductor structures on n–type 6H and 4H–SiC", *J. Appl. Phys.*, 79(10), 7814–7819 (1996).

E.M. Golstein, "Methods for improving the oxidation resistance of graphite", *Carbon*, 6(2), 223 (1968).

K. Jayaraj et al., "Low dielectric constant microcellular forms," $7^{th}$ DuPont Symp. on Polyimides in Microelectronics, p. 29 (1996).

R. Maury et al., "Chemical vapor co–deposition of C and SiC at moderate temperature for the synthesis of compositionally modulated $Si_xC_{1-x}$ ceramic layers", *Surface and Coatings Technology*, 76–77, 119–125 (1995).

R.D. Miller et al., Low dielectric constant polyimides and polyimide nanofoams, $7^{th}$ DuPont Symp. on Polyimides in Microelectronics, pp. 26–27 (1996).

C.S. Patuwathavithane et al., "Oxidation Studies for 6H–SiC", Amorphous and Crystalline Silicon Carbide IV, Proc. $4^{th}$ Int. Conf., Santa Clara, CA, 163–169 (1992).

J.M. Powers et al., "The surface oxidation of alpha–silicon carbide by $O_2$ from 300 to 1373 K", *Surface Science*, 244(1–2), 39–50 (1991).

C.E. Ramberg et al., "Oxidation Behavior of CVD and Single Crystal SiC at 1100° C.", *J. Electrochem. Soc.*, 142(11), L214–L216 (1995).

J.E. Song et al., "Thermal Oxidation of 6H–Silicon Carbide", *Korean Phys. Soc. Ungyong Mulli*, 8(4), 346–350 (1995).

J. Togo et al., "A Gate–side Air–gap Structure (GAS) to Reduce the Parasitic Capacitance in MOSFETs", 1996 Symposium on VLSLI Technology Digest of Technical Papers, 38–39 (1996).

* cited by examiner

METHOD FOR FORMING POROUS SILICON DIOXIDE INSULATORS AND RELATED STRUCTURES

FIELD OF THE INVENTION

The present invention relates to the fabrication of semiconductor integrated circuits, and more particularly, to methods and apparatus for isolating interconnects and conductive regions in semiconductor integrated circuits with porous silicon dioxide.

BACKGROUND OF THE INVENTION

In a semiconductor integrated circuit (IC), transistor structures are critical in the control of current flow. Transistors are formed on silicon, or similar semiconductor substrates. A transistor is usually formed with two heavily-doped, spaced apart regions of silicon, which are called a source and a drain. A gate structure is formed between the source and the drain, and operates to control the amount of electrical current which flows between the source and drain. When appropriate voltage is applied to the gate, an electrically conductive channel is formed under the gate, allowing current flow between the source and the drain. Transistor structures are electronically-coupled within an IC by a series of conductive interconnects and metal lines.

Part of the process of forming transistors involves the application of various layers of material. One such layer, an intermetal dielectric layer, is utilized as an insulator between the gate and metal interconnects/lines. Silicon dioxide is the most widely used insulating material in the fabrication of semiconductor ICs. However, borophosphosilicate glass (BPSG) has typically been preferred in the past for an intermetal dielectric insulating layer, due to BPSG's superior abilities to reflow at low temperatures and getter mobile species. However, BPSG has conventionally been plagued with unacceptable fixed electrical charge, thus causing problems when used in semiconductor devices.

It is desirable that low dielectric constant materials be used for an insulating layer between interconnects and conducting regions in an IC. The minimum physical value possible for a dielectric constant is that of air (i.e.,. the constant referred to as $\epsilon_o$). All other dielectric constants referred to herein are relative dielectric constants with respect to that of air, $\epsilon_o$. However, an insulating layer of air (i.e., an airgap) does not provide mechanical support for other layers within an IC structure. The relative dielectric constant for silicon dioxide, a common dielectric, is slightly less than four. The lower the dielectric constant, the lower the parasitic capacitance between interconnects and other conductive regions. Parasitic capacitance undesirably increases delay time and power consumption in an IC. Delay time is increased by operation of the time constant, RC, wherein R is the resistance and C is the capacitance of IC. The time constant of an IC is proportional to the time required to decrease current flow through the IC by half. In order to meet consumer demands for high speed, low power consumption ICs, parasitic capacitance must be decreased in an IC. As ICs are becoming more dense, parasitic capacitance is becomingly an increasingly significant problem.

For example, IC memories are becoming increasingly dense due to the demand for increased memory storage. A dynamic random access memory (DRAM) device comprises an arrangement of individual memory cells. Each memory cell includes a capacitor capable of holding data as an electrical charge and an access transistor for accessing the charge stored on the capacitor. Data can be either stored to the memory cells during a write mode, or data can be retrieved from the memory cells during a read mode. The data is transmitted on signal lines, referred to as bit lines, or digit lines, which are connected to input/output (I/O) lines through field-effect transistors (FETs) used as switching devices. Word lines are coupled to gates of the FETs for switching them ON/OFF as desired, which allows for reading/writing to a particular memory cell.

Conventional dynamic memories use memory cells fabricated as capacitors in an integrated circuit to store data. The pairs of digit lines are fabricated as metal or silicided/polycided polysilicon lines on the integrated circuit and are connected to the memory cells for transmitting data stored in the memory cells. Although unique fabrication techniques and processes have been developed to reduce the size of the memory cells and access circuitry, the physical spacing requirements for the array architecture create a barrier to maximizing the available die area. That is, the reductions in memory cell size cannot be fully exploited due to the capacitance between conductive digit lines, word lines, interconnects, gates, and other conductive regions. In particular, each individual digit line is highly capacitive, due to the large quantity of attached memory bits, the length of the line, and its proximity to other features. This capacitance dictates the design parameters of die circuitry. Furthermore, these problems have conventionally been compounded due to the use of digit line pairs for determining the logic of a memory cell.

In the past, open digit line array architecture was most commonly used for DRAM circuitry. Such architecture is characterized by a memory cell located at each intersection between a word line and a digit line, or digit line complement. This type of architecture increases the chip density. However, several problems prevent such architecture from meeting the needs of highly dense ICs. Such problems include coupling between digit lines and high internal noise. Coupling between adjacent digit lines is inversely proportional to their spacing. As devices become smaller and array density increases, the coupling problem becomes more pronounced.

Alternatively, a folded digit line architecture was designed to improve noise immunity of such devices. Folded digit line architecture is characterized by a memory cell located at every other digit line/word line intersection. This type of architecture does not provide the same degree of packing density seen in the open digit line architecture described above. Its packing density is about twenty-five-percent lower than in the open digit line architecture. However, noise immunity of the integrated circuit is improved using folded digit line architecture over the open digit line architecture.

A recent trend in fabricating integrated circuit memories includes twisting adjacent digit line pairs to improve signal-to-noise characteristics. However, such twisting is undesirable because it occupies valuable silicon area. As devices are becoming more dense, silicon area is becoming more scarce.

Another area in an IC in which parasitic capacitance is a problem is between polysilicon conductive gate structures and interconnect structures, which are, for example, formed over source/drain regions. The capacitance between these two types of conductive regions is often termed fringing capacitance. Previous attempts to minimize such capacitance have included etching an air gap between the gate and a sidewall structure and then forming an air gap cap over the gate and sidewall structure on the opposite side of the air gap. While this technique effectively decreases the dielectric constant of the material between the interconnect structure and the gate structure, such an air gap lacks mechanical strength.

A method for decreasing parasitic capacitance between interconnects and other conductive regions within an IC is needed to meet consumer demands for higher speed applications with lower power consumption. In particular, parasitic capacitance must be reduced between digit lines in a memory cell array. Furthermore, parasitic capacitance must be reduced between gate structures and conductive interconnects, without severely reducing the mechanical integrity of the IC.

SUMMARY OF THE INVENTION

Parasitic capacitance is reduced in a semiconductor integrated circuit (IC) by forming a porous silicon dioxide insulator between at least one interconnect and other conductive regions therein. The porous silicon dioxide layer provides mechanical integrity to the structure, while at the same time effectively reducing the dielectric constant as compared to, for example, silicon dioxide.

When, for example, porous silicon dioxide of this invention is formed between conductive digit lines in a memory cell array, noise immunity of the memory cell array is improved considerably. Thus, packing density in such memory cell arrays can be increased, as demanded by current consumers to meet high speed, low power consumption applications. Open digit line architecture can even be used, as compared to conventionally used folded digit line architecture, because coupling between adjacent digit lines is reduced when using the insulator of this invention.

In one aspect, the present invention provides a method for fabricating a porous silicon dioxide insulator, comprising steps of forming a substantially undoped layer of silicon carbide supported by a substrate; forming voids in the layer of silicon carbide to form a porous silicon carbide layer; and oxidizing the porous silicon carbide layer to form porous silicon dioxide.

In another aspect, the present invention provides a method for fabricating a porous silicon dioxide insulator, comprising forming a homogenous layer of silicon carbide supported by a substrate; forming voids in the layer of silicon carbide to form a porous silicon carbide layer; and oxidizing the porous silicon carbide layer to form porous silicon dioxide.

In another aspect, the present invention provides a method for fabricating a porous silicon dioxide insulator, comprising forming silicon carbide on a substrate, wherein the silicon carbide is selected from the group consisting of undoped silicon carbide, p-doped silicon carbide, and n-doped silicon carbide; forming voids in the silicon carbide to form porous silicon carbide; and oxidizing the porous silicon carbide to form porous silicon dioxide.

In another aspect, the present invention provides a method for fabricating a porous silicon dioxide insulator between a gate structure and an interconnect structure supported by a substrate, comprising forming a layer of silicon carbide on the substrate; defining a contact hole for an interconnect structure in the layer of silicon carbide over a source/drain region in the substrate; forming voids in the layer of silicon carbide to form a porous silicon carbide layer; and oxidizing the porous silicon carbide layer to form porous silicon dioxide between the gate structure and the interconnect structure.

In another aspect, the present invention provides a method for fabricating a memory cell array, comprising providing a plurality of transistors; depositing a layer of silicon carbide over the transistors; defining a plurality of contact holes for interconnects in the layer of silicon carbide over source/drain regions of the transistors; forming voids in the layer of silicon carbide to form a porous silicon carbide layer; oxidizing the porous silicon carbide layer to form porous silicon dioxide; forming a plurality of memory cells, insulated with the porous silicon dioxide; and forming a plurality of metal lines, insulated with the porous silicon dioxide.

In another aspect, the present invention provides an insulating layer in a semiconductor integrated circuit, comprising porous silicon dioxide having an effective relative dielectric constant of about 2.0 or less.

In another aspect, the present invention provides a memory cell array having digit lines and word lines, the array comprising a porous silicon dioxide insulating layer between adjacent digit lines and adjacent word lines.

These and other features and advantages of the present invention are described in more detail below.

DETAILED DESCRIPTION OF THE INVENTION

In the following detailed description, reference is made to the accompanying Figures which form a part hereof, and in which are illustrated specific embodiments in which the invention may be practiced. It is to be understood that other embodiments may be utilized and that structural changes may be made without departing from the scope of the present invention. For example, the terms wafer and substrate include any semiconductor-based structure. Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims.

Silicon carbide (SiC)-based insulator materials are used to lower the effective dielectric constant of resulting insulator layers as compared to, for example, silicon dioxide. During oxidation of SiC, carbon is easily reduced and it diffuses out of the structure, allowing for silicon dioxide to be formed in its place. Relatively high ratios of carbon to silicon allow for silicon dioxide to easily form in space previously occupied by carbon atoms. The resulting silicon dioxide layer is porous, thereby reducing the effective dielectric constant as compared to, for example, silicon dioxide. Furthermore, the mechanical integrity of the structure is not compromised by forming such a porous insulating layer, i.e., additional layers can be placed on the porous silicon dioxide layer and be supported by that layer.

Figure 1A:
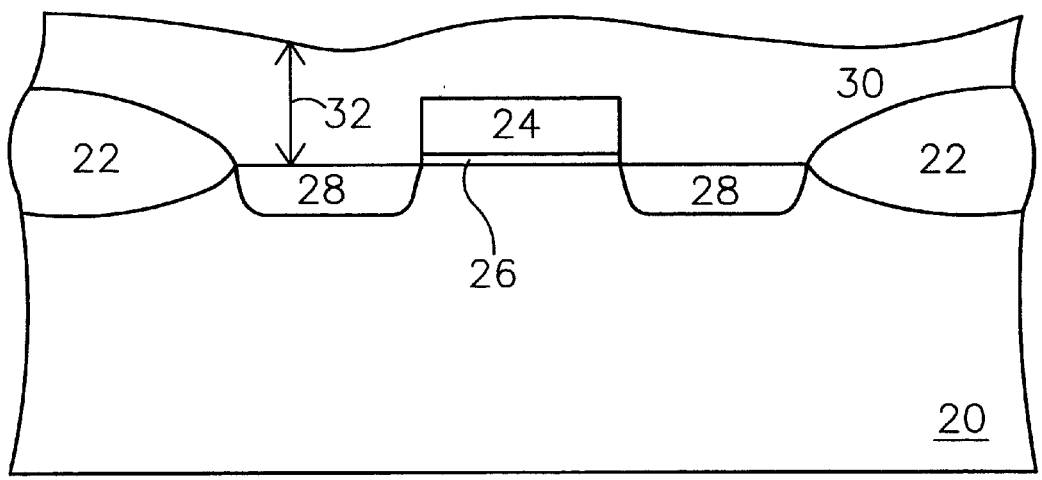
FIGS. 1A to 1F are cross-sectional representations of a silicon carbide-based insulating layer formed over active areas of a transistor and intermediate structures thereof.
Figure 1B:
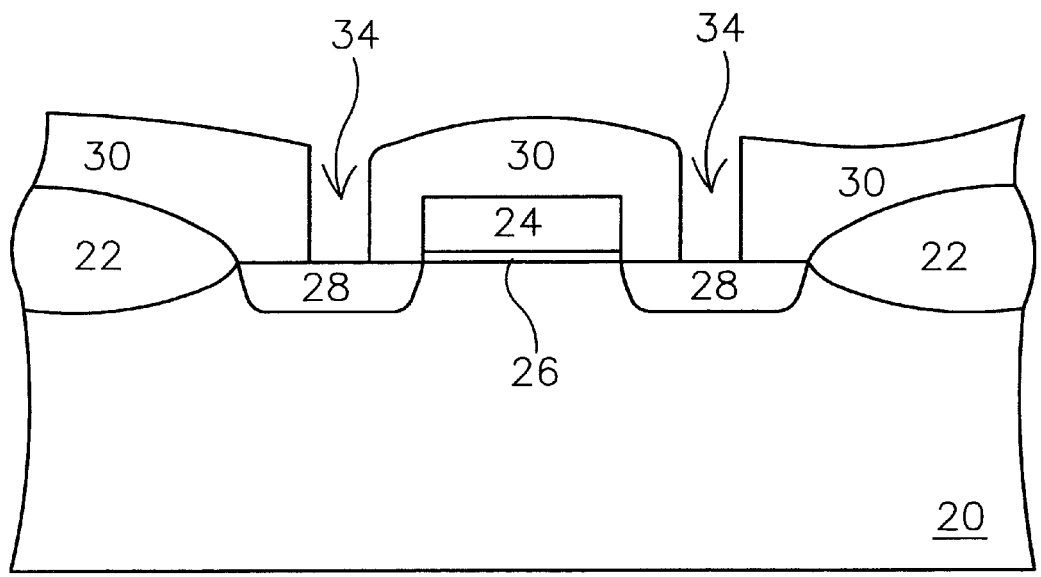
Figure 1C:
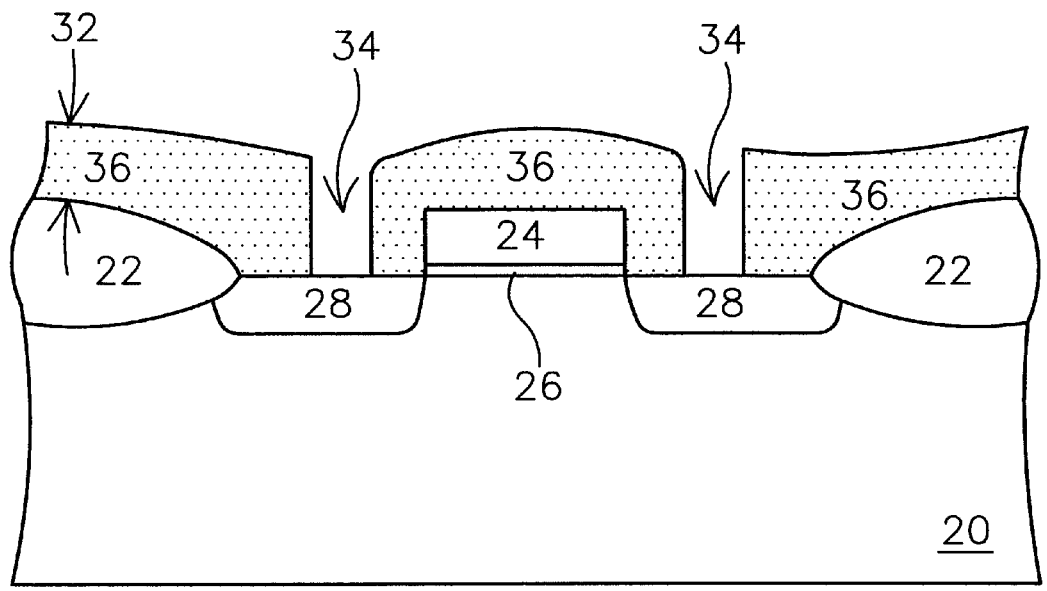
Figure 1D:
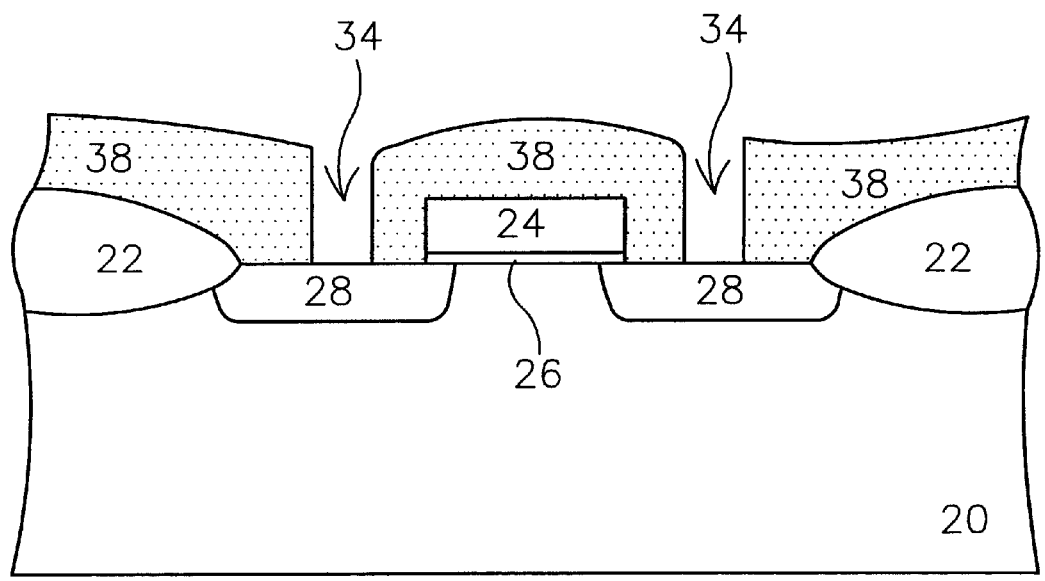
Figure 1E:
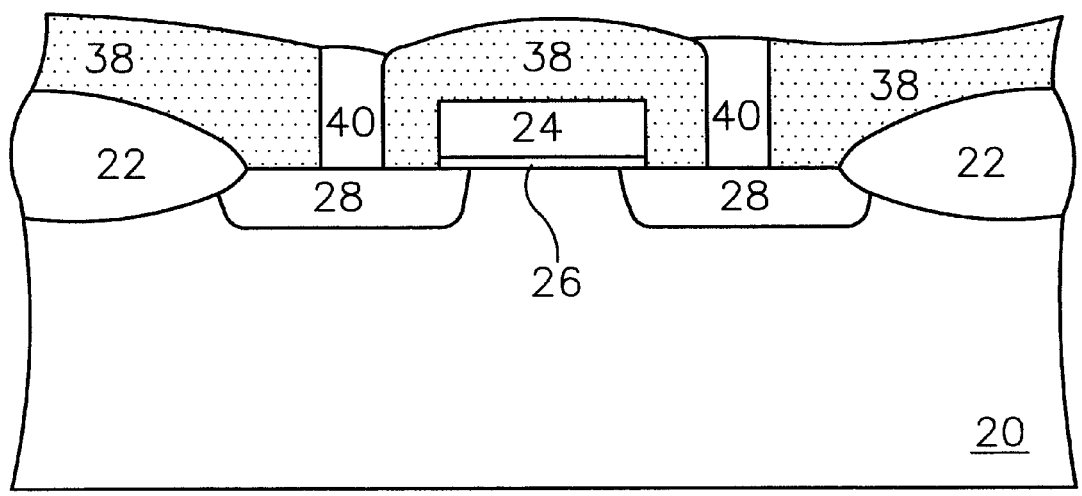
Figure 2A:
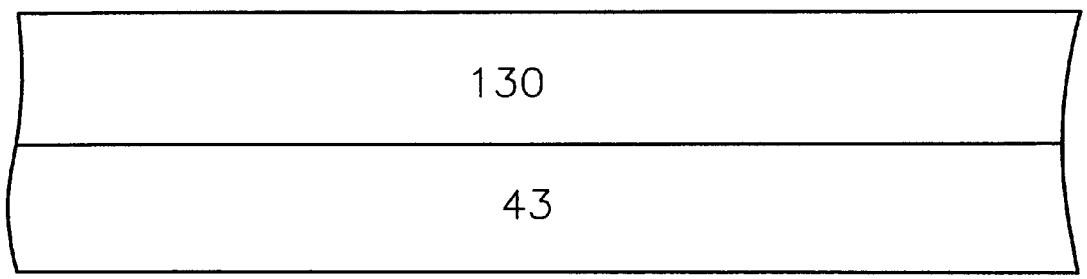
FIGS. 2A to 2D are cross-sectional representations of a silicon carbide-based insulating layer formed between interconnects/conductive regions, such as metallization layers, and intermediate structures thereof.
Figure 1F:
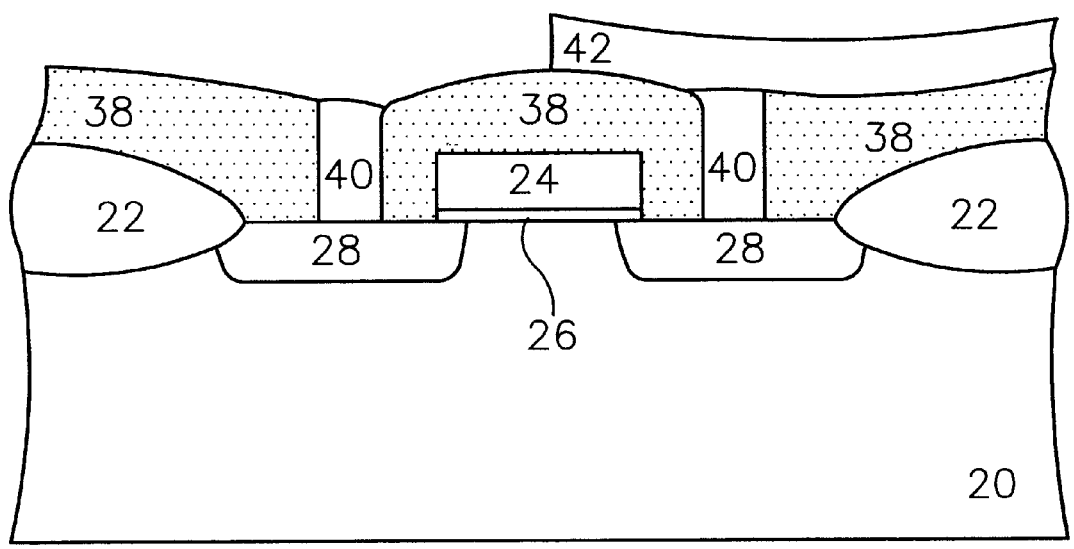
Figure 2B:
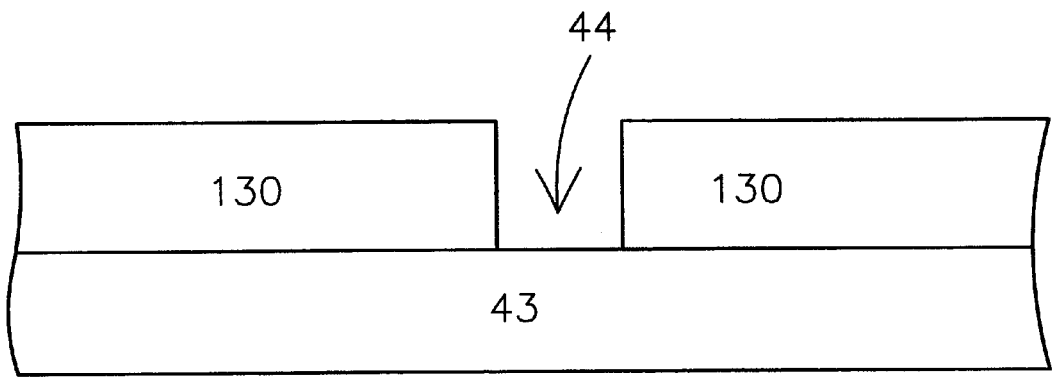
Figure 2C:
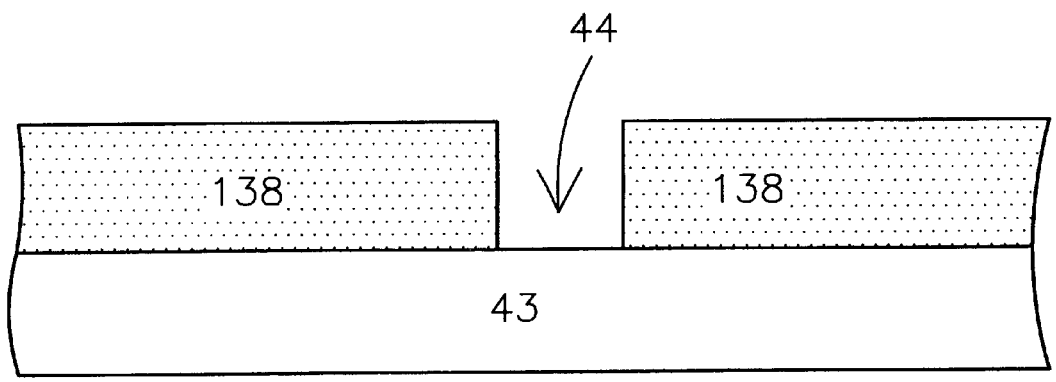
Figure 2D:
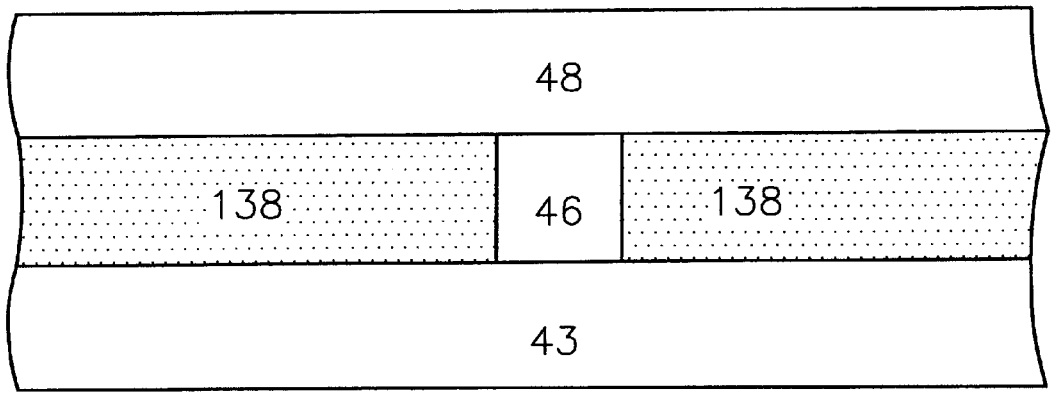
Figure 3:
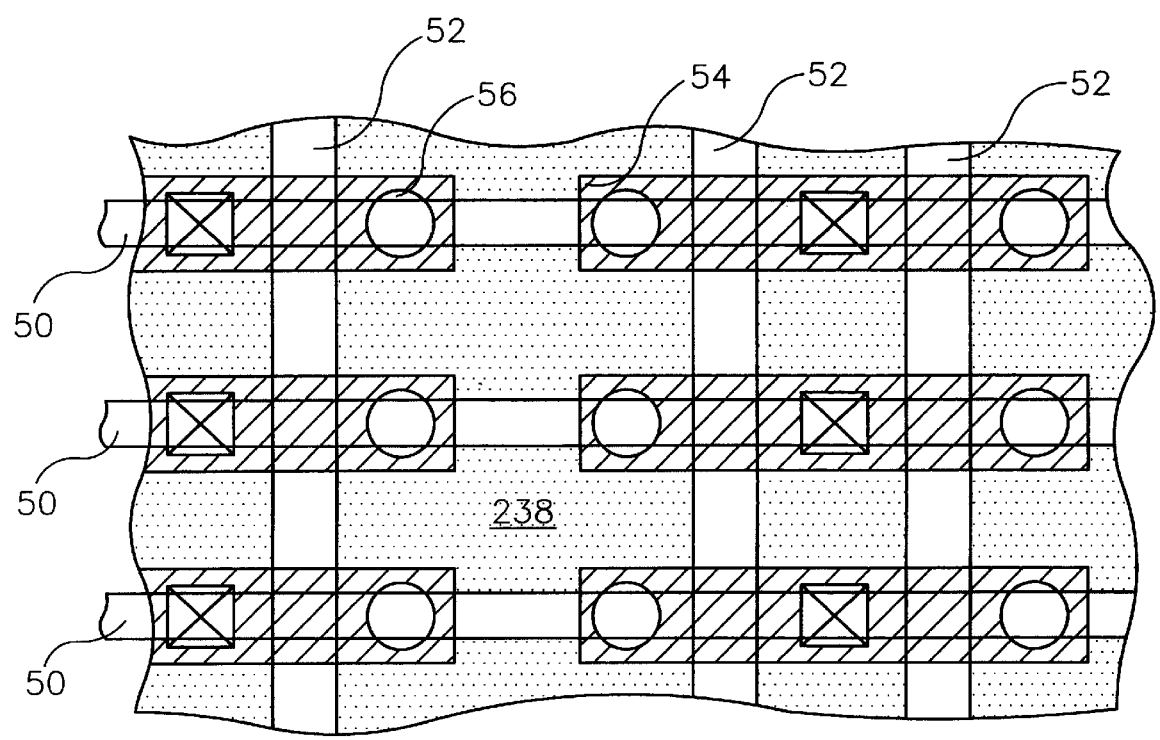
FIG. 3 is a plan view of a silicon carbide-based insulating layer formed between interconnects/conductive regions in a memory cell array.

FIGS. 1A to 3 are representative only—scaling and feature sizes in the Figures are not precise. This invention can be practiced wherever a low dielectric constant insulator is desired between interconnects and other conductive regions in an integrated circuit (IC). As used herein, interconnects are defined as contacts to active regions of individual devices and similar active regions within a substrate/wafer. Interconnects are also meant to include metal lines/layers, conductive vias, and similar conductive regions that connect individual devices within an IC. For example, digit lines and word lines in a memory cell array connect individual transistors within an IC. The insulator of this invention is particularly useful between such digit lines and word lines in a memory cell array. FIGS. 1A to 1F illustrate structures resulting from the formation of such an insulator 38 over active areas of a transistor. FIGS. 2A to 2D illustrate structures resulting from the formation of such an insulator 138 between conductive metallization layers 42 and 48. FIG. 3 illustrates a structure resulting from the formation of such an insulator 238 between conductive digit lines 50, word lines 52, and active areas 54 of transistors in a memory cell array.

As illustrated in FIGS. 1A to 1F, transistors are laterally-isolated on a substrate 20 with field oxide 22, as well known to one skilled in the art. For example, field oxide 22 may be formed by a Local Oxidation of Silicon (LOCOS) process. However, porous silicon dioxide formed in accordance with the present invention can be utilized instead to laterally isolate active devices on a substrate 20. A transistor, positioned between such field oxide 22, comprises a gate 24 and gate oxide 26 between source/drain regions 28.

In one embodiment, an intermediate structure of which is illustrated in FIG. 1A, SiC 30 is formed over active areas on the substrate 20 according to techniques well known to one skilled in the art. Preferably, a substantially undoped layer of SiC 30 is formed. It will be understood that more than one layer of SiC can be deposited to form the resulting SiC layer 30. Typically, however, the SiC layer 30 will be formed as a contiguous, homogenous layer in a single process step to reduce the fabrication costs and increase throughput. Thus, illustrations throughout are simplified to show one SiC layer 30, but layer 30 can represent a single layer or multiple consecutive layers of SiC 30. Furthermore, the layer 30 (or layers) can be doped with any suitable dopant or combination of dopants, provided that all of the layers (if more than one are deposited) are either n-doped or p-doped to avoid preferential etching of the different portions of the SiC layer 30 during the oxidation of the SiC layer 30 to form porous SiC. Numerous possibilities exist for specific types of active areas and supporting substrates, some of which will be later detailed, but examples are now shown by way of formation over active areas on a transistor.

SiC 30 is formed having a composition ratio of $Si_xC_{(1-x)}$, where x has a value that is within a range from greater than 0 to about 0.5. Any suitable technique for forming the desired SiC layer 30 can be used.

As one example, low pressure chemical vapor deposition (LPCVD) at a temperature of about 600 to 1,300 degrees Celsius can be used for depositing SiC 30. A mixture of gases, as well known to one skilled in the art, is used for the SiC precursor gases. For example, $C_6H_5isoPr$ and $SiEt_4$ is one such mixture of gases. Flow rates of the gases are adjusted to provide SiC 30 of the desired stoichiometry. The SiC 30 is deposited to a thickness 32, which is about the desired final thickness of the insulating layer.

As illustrated in FIG. 1B, contact holes 34 are then formed in the SiC layer 30 by any suitable method. As one example, the contact holes 34 can be formed by etching the SiC layer 30, using conventional photolithography and masking to define the contact holes 34.

Subsequently, the SiC layer 30 is made porous by any suitable method and the resulting structure is illustrated in FIG. 1C. A porous SiC layer 36 further lowers the dielectric constant of the resulting insulating layer by forming a multitude of voids in the SiC layer 30 that are occupied by air. While it is preferable to make the deposited SiC layer 30 porous throughout its entirety, only a portion of the SiC layer 30 need be made porous to effectuate the invention.

The porosity of SiC layer 36 provides a number of advantages. For example, when oxidizing pure, i.e., non-porous, SiC, the volume expansion of the growing silicon dioxide will cause the total volume of the non-porous SiC layer 30 to expand during its conversion to silicon dioxide. That expansion can create mechanical stress in an IC structure. Mechanical stress is undesirable as it causes crystal defects, particularly at interfaces between adjacent layers/regions, potentially degrading electrical performance. By providing a porous SiC layer 36, volume expansion during the formation of silicon dioxide and the resulting mechanical stresses can be avoided.

Furthermore, it is better to etch the SiC layer 30 prior to oxidation because the oxidation temperature needed for oxidizing pure SiC 30 (about 900 or 1,100 degrees Celsius, for steam and dry thermal oxidation, respectively) is too high for most modern silicon ICs. Higher oxidation temperatures are needed for oxidizing pure, non-porous SiC 30 due to slower diffusion of oxygen through a bulk layer.

Any reductions in the oxidation temperature are because of thermal budget limitations in IC processing. The thermal budget for fabrication of an IC is that combination of maximum time and temperature of heat treatments utilized in the fabrication of the IC. An IC can only be subjected to a limited number of thermal steps for a limited amount of time before its electrical performance is potentially detrimentally affected. For example, exceeding the thermal budget may also cause dopant gradients at junctions between two regions in an IC to diffuse, such that the potential barrier between the two regions is altered. Furthermore, thermal steps often cause dopants to migrate into undesired regions, altering device characteristics.

As stated previously, it is not necessary that the SiC layer 36 be porous throughout its entire thickness 32, but it is preferable in order to obtain the lowest final dielectric constant value possible, as compared to, for example, non-porous silicon dioxide. In addition, the porosity of layer 36 may vary through its thickness and/or across the surface of the substrate 20. The final porosity, i.e., percentage of voids of air within the total volume, of the SiC layer 36 is preferably about 30% to about 60%. More preferably, the final porosity of the SiC layer 36 is about 45% to 55%.

Electrochemical etching is one method for forming a porous SiC layer 36. In one example of an electrochemical etching process, dilute HF (for example, a 2.5% solution) is used. A bias voltage of about 1.4 Volts is applied to the SiC layer 30. Furthermore, a typical ultraviolet intensity of about 300 $mW/cm^2$ in a wavelength range of about 250 to about 400 nm is also applied to the SiC layer 30. Using this particular electrochemical etching process, it takes about 30 minutes to form several thousand angstroms of porous SiC 36. This example of an electrochemical etching process is only one of several possible ways of electrochemically etching. Another possible electrochemical etching solution includes $H_2SO_4$ or any chemical components capable of dissolving silicon dioxide (i.e., for example, bromine and fluorine). Variations of the example given above are acceptable, as well known to one skilled in the art.

Next, the porous SiC layer 36 is oxidized to produce the resulting structure as illustrated in FIG. 1D. During the oxidation step, carbon from the SiC layer 36 vaporizes as carbon dioxide and/or carbon monoxide and diffuses out of the structure into the environment. Remaining silicon then reacts with the oxygen to form silicon dioxide 38.

While the formation of silicon dioxide 38 from the silicon remaining after carbon oxidation inherently results in an increase in volume, this increase in volume is generally offset by a decrease in volume associated with carbon vaporizing from the layer. As a result, the thickness of the silicon dioxide layer 38 will generally be similar to the thickness of the porous SiC layer 36, thereby reducing mechanical stresses that could be associated with volumetric expansion during oxidation.

By using a relatively high composition ratio of carbon to silicon in the initial SiC layer 30, a very porous silicon dioxide 38 results due to the large volume decrease in carbon vaporizing from the porous SiC layer 36. As indicated above, the desired $Si_xC_{(1-x)}$ ratio is such that x has a value within a range from greater than 0 to about 0.5. When the composition ratio of carbon to silicon in the initial SiC layer 30 is relatively high, less silicon is present to oxidize in the porous SiC layer 36. Thus, less silicon dioxide 38 is formed per unit volume during oxidation of the porous SiC layer 36 when using a relatively high composition ratio of carbon to silicon in the initial SiC layer 30. The silicon dioxide 38 does not occupy all of the voids created from the high ratio of carbon vaporizing from the porous SiC layer 36 during oxidation because less silicon dioxide 38 is formed per unit volume.

As indicated above with reference to formation of the porous SiC layer 36, it is not necessary that the silicon dioxide layer 38 be porous throughout its entire thickness, but it is preferable in order to obtain the lowest final dielectric constant value possible, as compared to, for example, non-porous silicon dioxide. In addition, the porosity of silicon dioxide layer 38 may vary through its thickness and/or across the surface of the substrate 20. The final porosity, i.e., percentage of voids of air within the total volume, of the silicon dioxide layer 38 is preferably about 30% to about 60%. More preferably, the final porosity of the silicon dioxide layer 38 is about 45% to 55%. One limit on the porosity of the silicon dioxide insulating layer 38 is the need for enough structural support for subsequent layers to maintain mechanical integrity of the IC.

Pore size depends on the parameters used when forming the porous SiC layer 36 and oxidizing to form the silicon dioxide layer 38. Pore size should be such that the mechanical integrity of the resulting stricture is maintained. Furthermore, the exposed surfaces of the silicon dioxide layer 38 should be relatively smooth on a macro scale, such that layers can be formed thereon without extensive planarization prior to their formation.

Any type of oxidation, as known to one skilled in the art, can be utilized for this oxidation step, for example, dry thermal oxidation, wet thermal oxidation, or plasma oxidation. Wet thermal (i.e., steam) oxidation, however, may be preferred due to its relatively fast oxidation rate. Such wet or steam oxidation is performed at temperatures of about 900 degrees Celsius, also conserving valuable thermal budget. If even lower oxidation temperatures are desired, such as about 800 degrees Celsius, plasma oxidation can be used.

The resulting porous silicon dioxide layer 38 has an effective dielectric constant that is dependent on the composition ratio of carbon to silicon in the initial SiC layer 30 and the final porosity of the silicon dioxide layer 38. Thus, electric field lines between interconnects and other conductive regions in an IC, isolated with porous silicon dioxide according to this invention, will pass through a series of voids and silicon dioxide regions. The series combinations of the capacitive values of the voids (which typically will contain air having a relative dielectric constant of 1.0) and the silicon dioxide (with a relative dielectric constant of about 4.0) leads to a reduction in the dielectric constant of the porous silicon dioxide as compared to solid silicon dioxide, i.e., the relative dielectric constant is less than 4.0. For example, when voids and silicon dioxide occupy equal volumes in layer 38, the effective relative dielectric constant of the insulating layer 38 is about 1.6 when modeled based on a formula for parallel plate capacitors, the formula of which is well known in the art. However, other modeling methods can be used, but the evident result is that the effective dielectric constant of the porous silicon dioxide 38 is lower than that of conventional, non-porous silicon dioxide. More porous resulting silicon dioxides 38 have even lower effective dielectric constants. Preferably, the effective relative dielectric constant of the resulting silicon dioxide layer 38 is reduced to about 2.0 or less, even more preferably, the relative dielectric constant of the resulting silicon dioxide layer 38 is reduced to about 1.6 or less.

Such low dielectric constant insulating layers 38 reduce parasitic capacitance as compared to non-porous silicon dioxide insulating layers, including fringing parasitic capacitance, between interconnects and conductive regions. In this example, parasitic capacitance between the gate 24 and interconnects 40, which are subsequently formed in the contact holes 34 as well known to one skilled in the art (the resulting structure of which is illustrated in FIG. 1E), is reduced. However, the interconnect structures 40 can also be fabricated in the contact holes 34 prior to oxidizing the SiC layer 36 or prior to etching the initial SiC layer 30. Furthermore, as illustrated in FIG. 1F, a first metallization layer 42 can be formed and patterned over the structure illustrated in FIG. 1E because of the support offered by the porous silicon dioxide layer 38. Parasitic capacitance between the gate 24 and the first metallization layer 42 is reduced due to this inventive insulating layer 38. As compared to previous techniques for reducing the dielectric constant of insulating layers involving the use of air gaps, mechanical integrity of the IC is not compromised. Thus, delay time, power consumption, and noise are all reduced in an IC formed according to this invention. Thus, this invention allows a high density IC to operate more effectively, with minimal problems associated with stray parasitic capacitance.

In another embodiment, SiC 130 is formed on a conductive interconnect layer (according to the methods described above), such as a first metallization layer 43 in a multilevel-interconnected IC, a portion of which is illustrated in FIG. 2A. Vias 44 are then etched in the SiC layer 130, one of which is illustrated in FIG. 2B, by any suitable method. Porous silicon dioxide 138, as illustrated in FIG. 2C, is then formed according to the method previously described. Subsequently, the via 44 is filled with a conductive material 46, using any suitable method, and a second metallization layer 46 is formed over the porous silicon dioxide 138.

Such low dielectric constant insulating layers 138 reduce parasitic capacitance, including fringing parasitic capacitance, between interconnects and conductive regions. In this example, parasitic capacitance between adjacent metallization layers 43 and 48 is reduced. Yet, as compared to previous techniques of reducing the dielectric constant of insulating layers, mechanical integrity of the IC is not compromised because the porous silicon dioxide layer 138 can still support the metallization layer 43. Thus, delay time, power consumption, and noise are all reduced in an IC formed according to this invention. Thus, this invention allows a high density IC to operate more effectively, with minimal problems associated with stray parasitic capacitance.

In yet another embodiment, a SiC-based insulating layer 238 is formed according to the method of the invention between laterally-adjacent interconnects and conductive regions in an IC, as illustrated in FIG. 3. For example, porous silicon dioxide 238 is formed between conductive digit lines 50, word lines 52, and active areas 54 in a memory cell array. Furthermore, porous silicon dioxide 238 can be used as an insulating layer adjacent to capactive memory cells 56 in such an array. The memory cell array illustrated in FIG. 3 has an open digit line array architecture. The use of the low dielectric constant insulating layers 238 allows such an architecture to be used in dense memory cell array structures.

Such low dielectric constant insulating layers 238 reduce parasitic capacitance, including fringing parasitic capacitance, between interconnects and conductive regions. In this example, parasitic capacitance between conductive digit lines 50, word lines 52, active areas 54, and memory cells 56 is reduced. Yet, as compared to previous techniques of reducing the dielectric constant of insulating layers, mechanical integrity of the IC is not compromised. Thus, delay time, power consumption, and noise are all reduced in an IC formed according to this invention. Thus, this invention allows a high density IC to operate more effectively, with minimal problems associated with stray parasitic capacitance.

Numerous other applications for the insulating layer of this invention are possible. Where an insulating layer is needed in a semiconductor IC, the process steps of the present invention are substituted for previously used insulators and their processing steps. The SiC-based insulating layer of the present invention can be used to isolate active areas on a wafer, laterally isolate interconnects and other conductive regions, and vertically isolate interconnects and other conductive regions.

What is claimed is:

1. A method for fabricating a porous silicon dioxide insulator between a gate structure and an interconnect structure supported by a substrate, comprising:

forming a layer of silicon carbide on the substrate;

defining a contact hole for an interconnect structure in the layer of silicon carbide over a source/drain region in the substrate;

forming voids in the layer of silicon carbide to form a porous silicon carbide layer; and oxidizing the porous silicon carbide layer to form porous silicon dioxide between the gate structure and the interconnect structure.

2. The method of claim 1, further comprising the step of forming a conductive metallization layer over the porous silicon dioxide and interconnect structure.

3. A method for fabricating a memory cell array, comprising:

providing a plurality of transistors;

depositing a layer of silicon carbide over the transistors;

defining a plurality of contact holes for interconnects in the layer of silicon carbide over source/drain regions of the transistors;

forming voids in the layer of silicon carbide to form a porous silicon carbide layer;

oxidizing the porous silicon carbide layer to form porous silicon dioxide;

forming a plurality of memory cells, insulated with the porous silicon dioxide; and forming a plurality of metal lines, insulated with the porous silicon dioxide.

4. A method for fabricating a porous silicon dioxide insulator between a gate structure and an interconnect structure supported by a substrate, comprising:

forming a layer of silicon carbide on the substrate, wherein the silicon carbide comprises $Si_xC_{(1-x)}$, where x has a value that is within a range from greater than 0 to about 0.5;

defining a contact hole for an interconnect structure in the layer of silicon carbide over a source/drain region in the substrate;

forming voids in the layer of silicon carbide to form a porous silicon carbide layer; and oxidizing the porous silicon carbide layer to form porous silicon dioxide between the gate structure and the interconnect structure.

5. The method of claim 4, wherein the porous silicon dioxide has a porosity of about 30% to about 60%.

6. The method of claim 4, wherein the porous silicon dioxide has an effective dielectric constant of about 2.0 or less.

7. The method of claim 4, wherein the porous silicon dioxide has a porosity of about 30% to about 60% and an effective dielectric constant of about 2.0 or less.

8. The method of claim 4, further comprising the step of forming a conductive metallization layer over the porous silicon dioxide and interconnect structure.

9. A method for fabricating a porous silicon dioxide insulator between a gate structure and an interconnect structure supported by a substrate, comprising:

forming a layer of silicon carbide on the substrate;

defining a contact hole for an interconnect structure in the layer of silicon carbide over a source/drain region in the substrate;

forming voids in the layer of silicon carbide to form a porous silicon carbide layer; and oxidizing the porous silicon carbide layer to form porous silicon dioxide between the gate structure and the interconnect structure, wherein the porous silicon dioxide has a porosity of about 30% to about 60%.

10. The method of claim 9 wherein the porous silicon dioxide has an effective dielectric constant of about 2.0 or less.

11. The method of claim 9, further comprising the step of forming a conductive metallization layer over the porous silicon dioxide and interconnect structure.

12. A method for fabricating a porous silicon dioxide insulator between a gate structure and an interconnect structure supported by a substrate, comprising:

forming a layer of silicon carbide on the substrate;

defining a contact hole for an interconnect structure in the layer of silicon carbide over a source/drain region in the substrate;

forming voids in the layer of silicon carbide to form a porous silicon carbide layer; and oxidizing the porous silicon carbide layer to form porous silicon dioxide between the gate structure and the interconnect structure, wherein the porous silicon dioxide has an effective dielectric constant of about 2.0 or less.

13. The method of claim 12 further comprising the step of forming a conductive metallization layer over the porous silicon dioxide and interconnect structure.

14. A method for fabricating a memory cell array, comprising:

providing a plurality of transistors;

depositing a layer of silicon carbide over the transistors, wherein the silicon carbide comprises $Si_xC_{(1-x)}$, where x has a value that is within a range from greater than 0 to about 0.5;

defining a plurality of contact holes for interconnects in the layer of silicon carbide over source/drain regions of the transistors;

forming voids in the layer of silicon carbide to form a porous silicon carbide layer;

oxidizing the porous silicon carbide layer to form porous silicon dioxide;

forming a plurality of memory cells, insulated with the porous silicon dioxide; and forming a plurality of metal lines, insulated with the porous silicon dioxide.

15. The method of claim 14, wherein the porous silicon dioxide has a porosity of about 30% to about 60%.

16. The method of claim 14, wherein the porous silicon dioxide has an effective dielectric constant of about 2.0 or less.

17. The method of claim 14, wherein the porous silicon dioxide has a porosity of about 30% to about 60% and an effective dielectric constant of about 2.0 or less.

18. A method for fabricating a memory cell array, comprising:

providing a plurality of transistors;

depositing a layer of silicon carbide over the transistors;

defining a plurality of contact holes for interconnects in the layer of silicon carbide over source/drain regions of the transistors;

forming voids in the layer of silicon carbide to form a porous silicon carbide layer;

oxidizing the porous silicon carbide layer to form porous silicon dioxide, wherein the porous silicon dioxide has a porosity of about 30% to about 60%;

forming a plurality of memory cells, insulated with the porous silicon dioxide; and forming a plurality of metal lines, insulated with the porous silicon dioxide.

19. The method of claim 18, wherein the porous silicon dioxide has an effective dielectric constant of about 2.0 or less.

20. A method for fabricating a memory cell array, comprising:

providing a plurality of transistors;

depositing a layer of silicon carbide over the transistors;

defining a plurality of contact holes for interconnects in the layer of silicon carbide over source/drain regions of the transistors;

forming voids in the layer of silicon carbide to form a porous silicon carbide layer;

oxidizing the porous silicon carbide layer to form porous silicon dioxide, wherein the porous silicon dioxide has an effective dielectric constant of about 2.0 or less;

forming a plurality of memory cells, insulated with the porous silicon dioxide; and forming a plurality of metal lines, insulated with the porous silicon dioxide.

* * * * *